United States Patent
Spikes et al.

[11] Patent Number: 5,923,992
[45] Date of Patent: Jul. 13, 1999

[54] INTEGRATED CIRCUIT FORMED WITH SHALLOW ISOLATION STRUCTURES HAVING NITRIDE PLACED ON THE TRENCH DIELECTRIC

[75] Inventors: Thomas E. Spikes, Austin; Mark I. Gardner, Cedar Creek; Fred N. Hause, Austin, all of Tex.

[73] Assignee: Advanced Micro Devices, Inc., Houston, Tex.

[21] Appl. No.: 08/798,978

[22] Filed: Feb. 11, 1997

[51] Int. Cl.[6] .......................... H01L 49/00; H01L 27/02; H01L 29/78
[52] U.S. Cl. .......................... 438/424; 438/221; 438/218
[58] Field of Search .......................... 438/424, 221, 438/286, 218, 219, FOR 222–228

[56] References Cited

U.S. PATENT DOCUMENTS

| | | | |
|---|---|---|---|
| 4,729,006 | 3/1988 | Dally et al. | 357/42 |
| 5,433,794 | 7/1995 | Fazan et al. | 148/33.3 |
| 5,733,383 | 3/1998 | Fazan et al. | 148/33.3 |

*Primary Examiner*—Charles Bowers
*Assistant Examiner*—David S. Blum

*Attorney, Agent, or Firm*—Kevin L. Daffer; Conley, Rose & Tayon

[57] ABSTRACT

A method for protecting the trench dielectric fill for a shallow trench isolation structure by forming a protective layer upon the upper surface of the trench dielectric is presented. In a preferred embodiment, the protective layer comprises a layer of nitride formed upon a layer of oxide. Various etch and cleaning processes during the semiconductor device formation may cause damage to the trench dielectric. A shallow trench is typically formed early in the process sequence. A trench dielectric is deposited into the shallow trench and then planarized so that the upper surface of the trench dielectric is at the same level as the upper surface of the trench dielectric. Damage to the upper surface of the trench dielectric may be caused during several of the subsequent processing steps, including: the etch process used to form the polysilicon gate; the etch process used to form oxide spacers upon the sidewall surfaces of the conductive structures; the etch process used to form contact holes through interlevel dielectrics; and the metal deposition into the contact holes used to establish an electrical contact with the conductive structures. By forming a protective nitride layer upon the upper surface of the trench dielectric, the trench dielectric is better protected against damage.

9 Claims, 4 Drawing Sheets

5,923,992

INTEGRATED CIRCUIT FORMED WITH SHALLOW ISOLATION STRUCTURES HAVING NITRIDE PLACED ON THE TRENCH DIELECTRIC

BACKGROUND OF THE INVENTION

1. Field of the Invention

This invention relates to the field of semiconductor processing and, more particularly, to a method of forming a shallow trench isolation structure with a protective nitride layer formed upon the upper surface of the trench dielectric oxide.

2. Description of Relevant Art

The fabrication of an integrated circuit involves placing numerous devices on a single semiconductor substrate. Isolation structures are needed to electrically isolate one device from another. Isolation structures define the field regions of the semiconductor substrate and the device areas define the active regions. The devices are interconnected with conducting lines running over the isolation structures.

A popular isolation technology used in integrated circuits involves the process of locally oxidizing silicon. Local oxidation of silicon, or LOCOS process, involves oxidizing field regions between device active regions. The oxide grown in field regions is termed field oxide. Field oxide is grown during the initial stages of integrated circuit fabrication before the gate conductor and source/drain regions are formed in active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, there are several problems inherent to LOCOS. First, a growing field oxide extends entirely across the field region and laterally as a bird's beak. In many instances, the bird's beak can unacceptably encroach into the device active area. Second, the pre-implanted channel-stop dopant often redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs.

Many of the problems associated with LOCOS technology are alleviated by an isolation technique known as shallow trench isolation ("STI"). Despite advances made to decrease bird's-beak, channel-stop encroachment and non-planarity, it appears that LOCOS technology is still inadequate for deep submicron technologies. The shallow trench process, herein "trench process", is better suited for isolating densely spaced active devices having field regions less than, e.g., 3.0–5.0 $\mu$m in the lateral dimension. Narrow width STIs may be used to isolate densely spaced devices and larger width STIs may be used to isolate devices that are spaced further apart.

The trench process involves the steps of etching a silicon substrate surface to a relatively shallow depth, e.g., between 0.2 to 0.5 microns, and then filling the shallow trench with a deposited dielectric (referred to henceforth as "trench dielectric"). Some trench processes include an interim step of growing oxide on the trench walls prior to filling the trench with the dielectric. The trench dielectric may comprise decomposed tetra-ethyl-ortho-silicate ("TEOS") deposited using a chemical-vapor deposition ("CVD") process. CVD may, for example, be performed at approximately 400–800° C. in an atmospheric pressure or low-pressure chamber.

Exemplary shallow trench structures are shown in FIG. 1. Semiconductor substrate 10 is typically a single-crystalline silicon doped n-type or p-type. Shallow trenches 24 and 26 are etched into field regions 16 and 20 of semiconductor substrate 10. A trench dielectric such as TEOS may be used to fill the trenches. A thin layer of gate oxide 28 is thermally grown upon upper surface 12 of semiconductor substrate 10 and, to a lesser thickness, upon the trench dielectric. A layer of polysilicon is deposited upon gate oxide 28 and then patterned to form conductive structures 30, 32, and 34. Conductive structure 32 formed in active region 18 is used to align source and drain junction areas of a subsequently formed transistor. Conductive structures 30 and 34 are formed in field regions 16 and 20 and above shallow trenches 24 and 26. Conductive structures 30 and 34 may be used as conductive lines running over the field regions to interconnect devices in the active regions with one another.

During the etch process to pattern the polysilicon, possible damage to the trench dielectric may occur. Since it is very difficult to determine the exact end-point for the etch, the etchant may attack areas 36, 38, 40, and 42 and remove a portion of the trench dielectric to expose the corners and part of the sidewall surfaces of active areas adjacent shallow trenches 24 and 26. Damage to the corners of the shallow trenches not only degrades the isolation capabilities of the shallow trenches but, more importantly, reduces the transistor gate within the active areas beyond acceptable design levels.

As shown in FIG. 2, possible trench dielectric damage may also occur during oxide spacer formation. In processing steps subsequent to forming the polysilicon gate, a conformal oxide layer is deposited, preferably using CVD, upon the semiconductor topography and then anisotropically etched. An anisotropic etch removes material faster along horizontal surfaces than vertical surfaces. As a result, oxide spacers 44, 46, 48, 50, 52, and 54 are formed. The spacers are formed upon the sidewall surfaces of the conductive structures for various reasons, including: protecting the edges of the conductive structures from damage due to subsequent processing such as cleaning and etching; enabling self-aligned source/drain implants; and enabling self-aligned silicide formation.

During the anisotropic etch process, a portion of the trench dielectric in areas 36, 38, 40, and 42 may be undesirably removed. A typical subsequent processing step is the formation of silicide upon the conductive structures and upon the source/drain regions in the active areas. Silicide is formed upon exposed silicon to decrease the ohmic resistance between the silicon and subsequently deposited metal. Since the level of the trench dielectric due to damage from etching is now below upper surface 12 of semiconductor substrate 10, silicide will also form along the exposed silicon-based trench sidewalls. If areas 36, 38, 40, and 42 extend beneath the source/drain edge, the silicide will establish an undesirable electrical short between itself and the substrate (i.e., channel). Such a short would render the device non-functional. It would thus again be desirable to protect the upper surface of the trench dielectric against damage from etching during spacer formation.

Turning now to FIG. 3, in subsequent processing steps, interlevel dielectric 60 is deposited upon the semiconductor topography. Interlevel dielectric 60 electrically isolates the devices formed upon the semiconductor substrate from overlying conductive lines. To establish electrical contact between the overlying conductive lines and the polysilicon conductive structures 30, 32, and 34, a contact hole, such as hole 62, is first etched into interlevel dielectric 60. Metal is subsequently deposited into contact hole 62 in order to establish the electrical connection. Preferably, the contact is formed such that the deposited metal contacts only the upper surface of conductive structure 30. However, in case of a small misalignment, contact hole 62 may be displaced by a small amount. If hole 62 is displaced far enough, a portion of the deposited metal may contact the trench dielectric of trench 24 with the possibility of the metal spiking through the dielectric. If the metal spikes through a long enough distance, either vertically through the trench floor or horizontally through the trench sidewalls, an undesirable electrical short may be established between the semiconductor substrate and the deposited metal. Such a short would again render the device non-finctional. For at least the same reasons as before, it would be desirable to be able to protect the upper surface of the trench dielectric and prevent the deposited metal from penetrating into the trench dielectric and contacting the substrate edge beneath the source/drain area.

The trench dielectric is susceptible to damage throughout the production process. As well as during other processing steps, the trench dielectric can be damaged during: (i) etching for the purpose of patterning the polysilicon conductive structures; (ii) etching for the purpose of forming spacers upon the sidewall surfaces of the conductive structures; and, (iii) etching a misaligned contact hole and depositing metal into it for the purpose of establishing contact to the conductive gate structures and/or source/drain junctions. It would thus be desirable to be able to protect the upper surface of the trench dielectric from etchants and other materials that might penetrate through the trench dielectric and cause damage.

SUMMARY OF THE INVENTION

The problems identified above are in large part addressed by an isolation structure comprising a shallow trench which is filled with a trench dielectric material and then covered with a layer of protective material. In a preferred embodiment, the protective layer comprises a layer of nitride. The nitride layer provides a more definite end-point for the etches used to form the conductive structures, the oxide spacers, and the contact holes and thus prevents deposited metal from spiking through the layer and into the trench oxide. In addition, the protective layer increases the total thickness of the trench dielectric and helps prevent the formation of parasitic transistor channels from forming beneath the trench floor. Conductive lines connecting devices pass over the field regions and can act as gate conductors and induce channels under the trench floors. This may induce leakage currents between, for example, the source of one transistor and the drain of another.

Broadly speaking, the present invention contemplates a method for forming an isolation structure. A semiconductor substrate is provided and a shallow trench isolation structure is formed into the field regions of the semiconductor substrate. The shallow trench electrically isolates the active regions of the semiconductor substrate from one another. To form the trench, a photoresist layer is first deposited upon the semiconductor substrate. A portion of the photoresist layer is exposed using a mask and the exposed portion of the photoresist layer is then etched to expose the field regions of the upper surface of the semiconductor substrate. Subsequently, a trench void is anisotropically etched into the substrate. A trench dielectric, preferably TEOS deposited by CVD at a temperature of approximately 400–800° C., is used to fill the trench. The trench dielectric is subsequently polished to become planar such that the upper surface of the trench dielectric is at substantially the same elevation level as the upper surface of the semiconductor substrate. A protective layer is then formed upon the trench dielectric. In a preferred embodiment, the protective layer is a composite layer comprising a layer of oxide and a layer of CVD nitride. A conductive structure is then formed upon the protective layer. In a preferred embodiment, the conductive structure comprises polysilicon which is deposited upon the protective layer and then patterned to form the conductive structure. A CVD oxide is then deposited upon the conductive structure and upon the protective layer. An anisotropic etch is then used to remove a portion of the oxide while leaving oxide spacers upon the sidewall surfaces of the conductive structures.

The present invention further contemplates an isolation structure. A shallow trench is formed into a semiconductor substrate. A trench dielectric, preferably a CVD oxide deposited from a TEOS source at a temperature of approximately 400–800° C., fills the trench. A protective layer lies upon the upper surface of the trench dielectric. In a preferred embodiment, the protective layer comprises a nitride layer formed upon an oxide layer. A conductive structure, preferably comprising polysilicon, is located upon the protective layer. Oxide spacers are upon the sidewall surfaces of the conductive structure to protect the sidewall surfaces of the conductive structures and enable self-aligned source/drain implants and self-aligned silicide formation.

BRIEF DESCRIPTION OF THE DRAWINGS

Other objects and advantages of the invention will become apparent upon reading the following detailed description and upon reference to the accompanying drawings in which.

Figure 1:
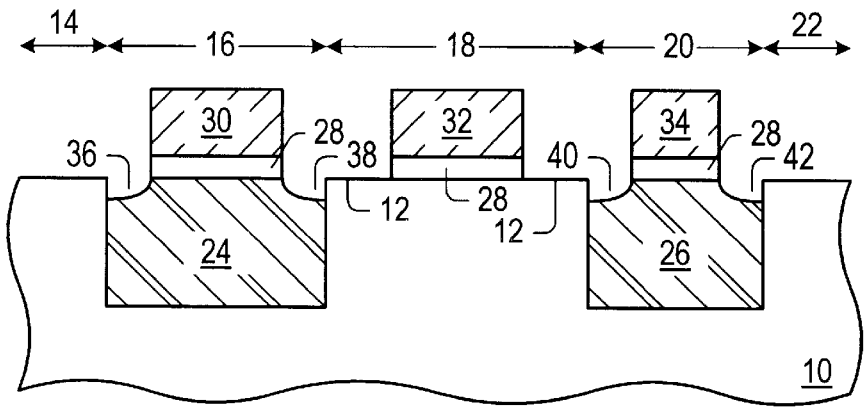
FIG. 1 is a partial cross-sectional view of a semiconductor topography showing possible damage to the trench dielectric during patterning of conductive structures according to a conventional process.
Figure 2:
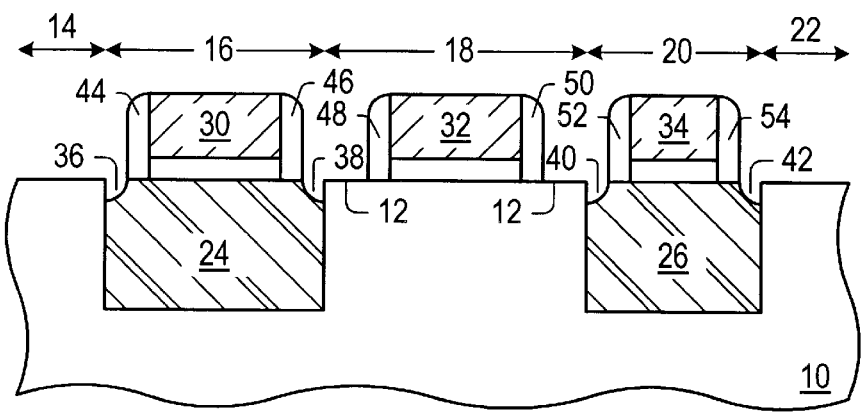
FIG. 2 is a partial cross-sectional view of a semiconductor topography showing possible trench dielectric damage during spacer formation upon the sidewall surfaces of conductive structures according to a conventional process.
Figure 3:
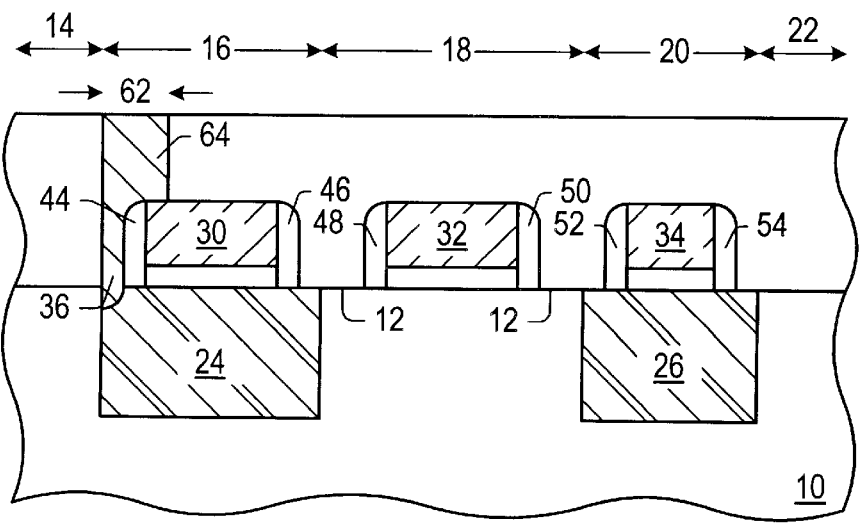
FIG. 3 is a partial cross-sectional view of a semiconductor topography showing possible trench dielectric damage during the etching of a metal contact opening and subsequent metal deposition according to a conventional process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 4:
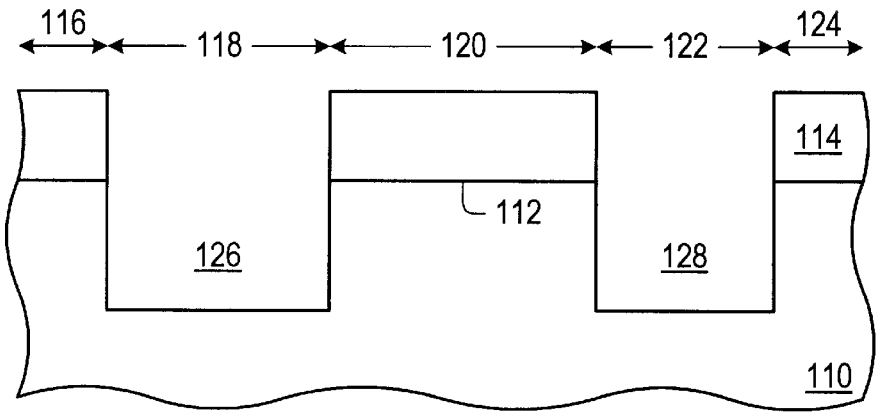
FIG. 4 is a partial cross-sectional view of a semiconductor topography showing the formation of two shallow trenches into the semiconductor substrate.

Turning now to the drawings, FIG. 4 shows a partial cross-sectional view of semiconductor substrate 110 and upper surface 112 of semiconductor substrate 110. Semiconductor substrate 110 preferably comprises lightly doped n-type or p-type single-crystalline silicon having a resistivity of approximately 12 ohms-cm. Photoresist layer 114 is deposited upon upper surface 112 of semiconductor substrate 110 and then patterned using conventional masking and etching steps. Photoresist layer 114 is patterned in such a way as to expose field regions 118 and 122 of semiconductor substrate 110 while covering active regions 116, 120, and 124. Active regions are where passive and active devices (i.e., transistors) will be subsequently formed, and field regions are where isolation structures exist to electrically isolate the active regions from each other. Shallow trenches 126 and 128 are then formed in exposed field regions 118 and 122. A chlorinated plasma etch is preferably used which etches silicon substrate 110 anisotropically. As a result, shallow trenches 126 and 128 are formed with substantially vertical sidewall surfaces.

Figure 5:
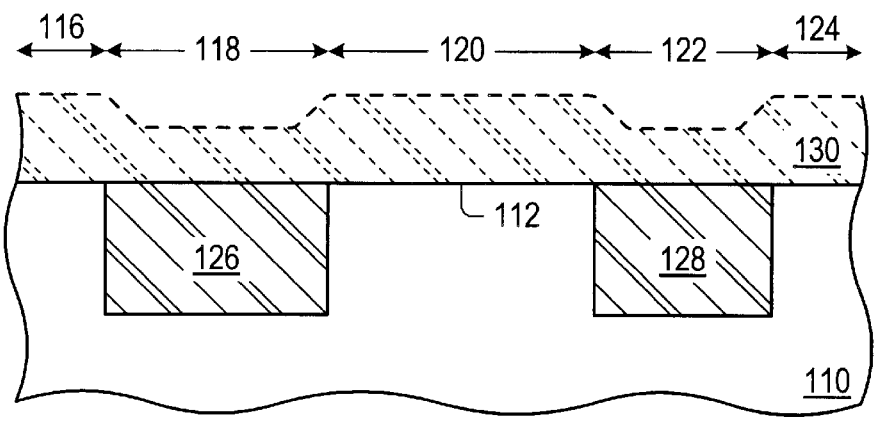
FIG. 5 is a partial cross-sectional view of a semiconductor topography according to a processing step subsequent to FIG. 4 in which a trench dielectric is deposited upon the semiconductor substrate and into the shallow trenches and then planarized to remove dielectric exterior to the shallow trenches.

Turning now to FIG. 5, trench dielectric 130 is deposited upon the semiconductor substrate and into shallow trenches 126 and 128. In a preferred embodiment, trench dielectric 130 comprises oxide from a TEOS source deposited with a CVD process. The upper surface of trench dielectric 130 conforms to the underlying contour of the shallow trenches. As a result, the upper surface of trench dielectric 130 in field regions 118 and 122 is lower than the upper surface in active regions 116, 120, and 124. The portion of trench dielectric 130 exterior to shallow trenches 126 and 128 is then removed. A CMP process is preferably used which combines a mechanical polishing pad with chemical abrasion. Raised areas contact the polishing pad to a greater extent than recessed areas. As a result, elevated features are removed faster without thinning flat areas as much. After the CMP, the upper surface of trench dielectric 130 is at the same level as upper surface 112 of semiconductor substrate 110.

Figure 6:
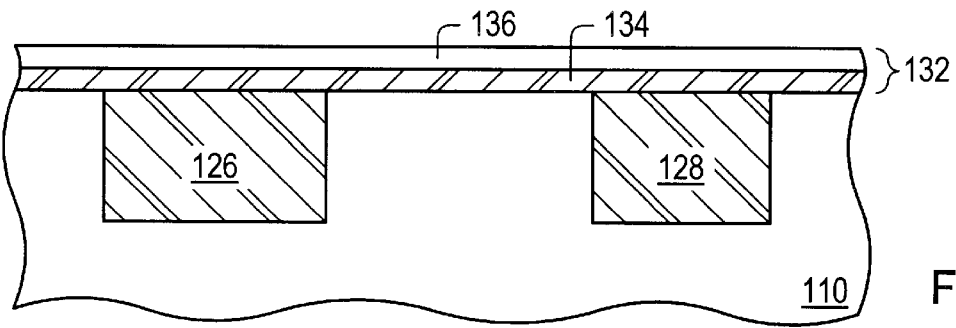
FIG. 6 is a partial cross-sectional view of a semiconductor topography according to a processing step subsequent to FIG. 5 in which a layer of oxide and a layer of nitride are formed upon the semiconductor topography.

Turning now to Fig.6, composite layer 132 is formed upon the whole semiconductor topography. In a preferred embodiment, composite layer 132 comprises oxide layer 134 and nitride layer 136. Oxide layer 134 is preferably grown in a thermal oxidation furnace using temperatures of approximately 700–900° C. for a relatively short (e.g., less than 20 minutes) time. Oxide layer 134 may be grown to a thickness of approximately 15–600 Å. Nitride layer 136 is then deposited upon oxide layer 134, preferably by CVD. The function of oxide layer 134, called pad or buffer oxide, is to cushion the transition of stresses between silicon substrate 110 and overlying nitride layer 136. In general, the thicker the oxide, the less edge force is transmitted to the silicon from the nitride. Usually, the minimum oxide thickness that will avoid the formation of dislocations is used.

Figure 7:
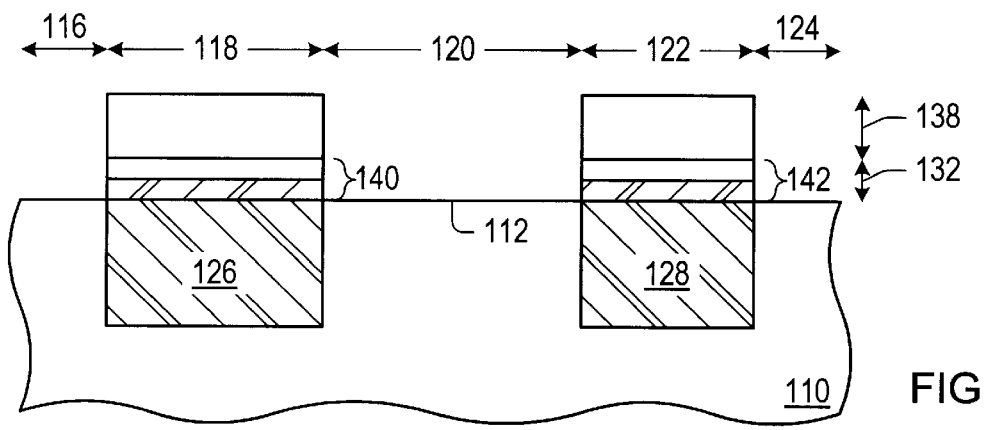
FIG. 7 is a partial cross-sectional view of a semiconductor topography according to a processing step subsequent to FIG. 6 in which the oxide and nitride layers are removed from the active regions of the semiconductor substrate.

Turning now to FIG. 7, photoresist layer 138 is deposited upon composite layer 132. Photoresist layer 138 is then patterned using conventional masking and etching techniques to expose composite layer 132 in active areas 116, 120, and 124. An anisotropic etch is then used to remove composite layer 132. Remaining photoresist layer 138 in field regions 118 and 122 is subsequently removed. Depending on the type of the photoresist used, an organic stripper, preferably phenol-free, may be used to remove the photoresist. An inorganic stripper like sulfuric acid with hydrogen peroxide or ammonium persulfate may also be used.

Figure 8:
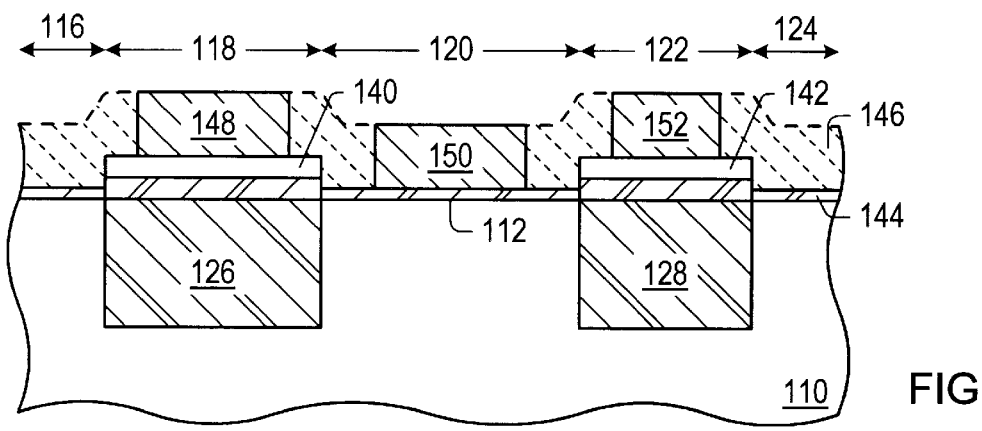
FIG. 8 is a partial cross-sectional view of a semiconductor topography according to a processing step subsequent to FIG. 7 in which a polysilicon layer is deposited upon the semiconductor topography and then patterned to form gate conductors in the active regions and conductive interconnects in the field regions above the shallow trenches.

Turning now to FIG. 8, gate dielectric 144 is thermally grown upon upper surface 112 of semiconductor substrate 110. In a preferred embodiment, gate dielectric 144 is grown in a thermal oxidation furnace at temperatures of approximately 700–900° C. In alternative embodiments, gate dielectric 144 may be formed in a rapid thermal anneal apparatus where the semiconductor substrate is subjected to a temperature of approximately 700–1000° C. for approximately 10–30 minutes. The thickness of gate dielectric 144 is preferably 15–200 Å. Polysilicon layer 146 is subsequently deposited upon gate dielectric 144 and across the patterned composite layer, preferably using a low-pressure CVD process, and then patterned using conventional masking and etching techniques. As a result, conductive structures 148, 150, and 152 are formed. Conductive structure 150 may be used as a gate conductor for a subsequently formed transistor. Conductive structures 148 and 152 may be used as interconnecting conductors to connect devices in active regions with one another. During the etching of the polysilicon, protective layers 140 and 142 acts as an etch-stop and prevents the etchant from attacking the underlying dielectric. Damage to the trench dielectric is thus prevented.

Figure 9:
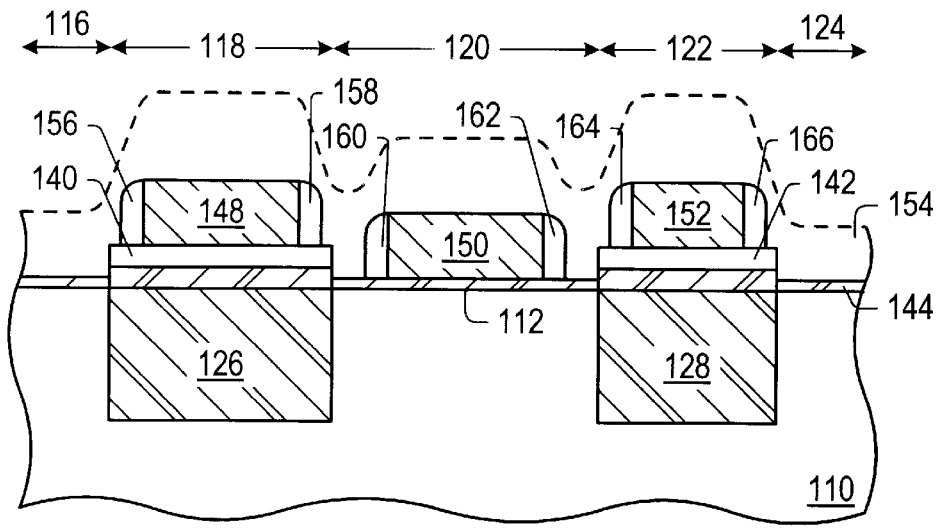
FIG. 9 is a partial cross-sectional view of a semiconductor topography according to a processing step subsequent to FIG. 8 in which oxide spacers are formed upon the sidewall surfaces of the polysilicon gate conductors and polysilicon interconnects.

Referring now to FIG. 9, conformal oxide layer 154 is deposited upon the semiconductor topography. In a preferred embodiment, conformal oxide layer 154 comprises a CVD oxide which is deposited by decomposing TEOS at approximately 400–800° C. This produces a film with excellent conformality with an upper surface that closely follows the underlying contour. An anisotropic dry-etch process is then used which clears the oxide in the flat areas while leaving oxide spacers 156, 158, 160, 162, 164, and 166 upon the sidewall surfaces of conductive structures 148, 150, and 152. Protective layers 140 and 142 prevent damage to the underlying trench dielectric during the anisotropic dry etch used to form the spacers. Absent the spacers, the etchant could possibly attack the trench dielectric and remove a portion of it. Damage to the trench dielectric is thus prevented by the existence of protective layers 140 and 142.

Figure 10:
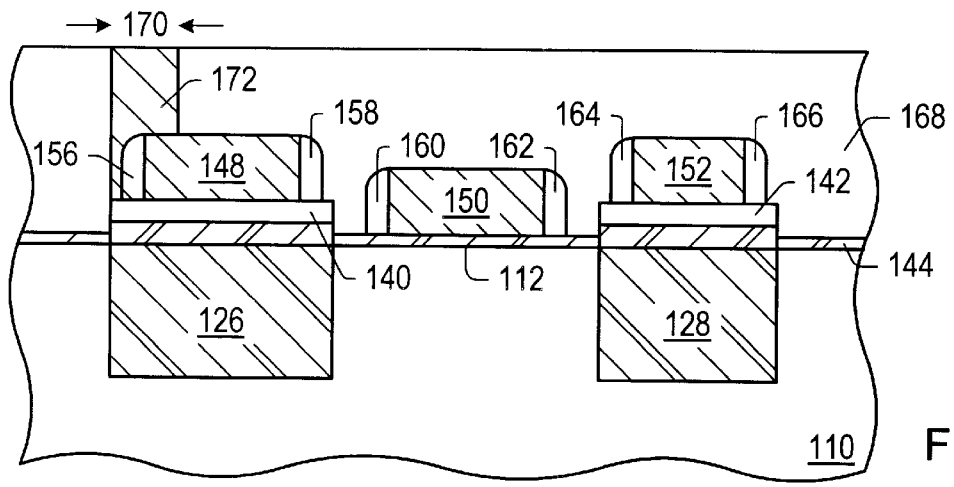
FIG. 10 is a partial cross-sectional view of a semiconductor topography according to a processing step subsequent to FIG. 9 in which a contact hole is etched through the interlevel dielectric and a metal is deposited into the hole to establish an electrical contact to the polysilicon conductive structures.

Turning now to FIG. 10, interlevel dielectric 168 is deposited upon the semiconductor topography. Interlevel dielectric preferably comprises TEOS or silica glass which is deposited by CVD. Boron and/or phosphorus can be incorporated into the TEOS to increase its flow and reflow properties. After deposition, interlevel dielectric 168 is reheated to reflow and produce a substantially planar upper surface. In order to establish electrical contact to the conductive structures, such as conductive structure 148, contact hole 170 is first formed. A photoresist layer is deposited upon the upper surface of interlevel dielectric 168 and then patterned to expose a portion of the upper surface. Contact hole 170 is then etched into interlevel dielectric 168, preferably with anisotropic plasma etch. Subsequently, metal 172 is deposited into the contact hole. The alignment of contact hole 170 should be such that metal 172 contacts only the upper surface of conductive structure 148. However, perfect alignment is sometimes difficult to achieve and contact hole 170 may be laterally shifted a certain distance such that metal 172 comes in contact with a portion of the protective layer 140. Protective layer 140 prevents the etchant used to form contact hole 170 and deposited metal 172 from attacking the underlying trench dielectric.

It will be appreciated to those skilled in the art having the benefit of this disclosure that this invention is believed to be capable of forming a shallow trench isolation structure filled with a trench dielectric which is capped with a protective layer. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming an isolation structure, comprising:

providing a semiconductor substrate having an upper surface defined by field regions adjacent active regions;

removing a portion of the semiconductor substrate upper surface within the field regions to form a trench which serves to electrically isolate adjacent active regions;

forming a trench dielectric within said trench such that an upper surface of said trench dielectric is at the same level as an upper surface of said semiconductor substrate;

forming a protective layer, subsequent to forming a trench dielectric within said trench, upon said silicon substrate and upon the upper surface of said trench dielectric;

removing said protective layer above said active regions while maintaining said protective layer upon the upper surface of said trench dielectric material; and patterning a conductive structure upon said protective layer.

2. The method as recited in claim 1, wherein the step of removing a portion of the semiconductor substrate upper surface comprises:

depositing a photoresist layer upon said semiconductor substrate;

exposing a portion of said photoresist layer using a mask;

removing exposed portion of said photoresist to expose the field regions of said semiconductor substrate; and anisotropically etching the trench into said semiconductor substrate.

3. The method as recited in claim 1, wherein the step of forming said trench dielectric comprises:

depositing a CVD oxide from a TEOS source at a temperature of approximately 400–800° C., and removing the portion of the oxide extending above the upper surface of said semiconductor substrate.

4. The method as recited in claim 1, wherein the step of forming said protective layer comprises forming a composite layer, wherein said composite layer, comprises:

thermally growing an oxide layer upon said silicon substrate and said trench dielectric; and depositing a nitride layer upon said thermally grown oxide.

5. The method as recited in claim 1, wherein the step of forming said conductive structure comprises:

depositing a layer of polysilicon upon said protective layer;

patterning the layer of polysilicon to form conductive structures upon a portion of said protective layer in said field regions above said shallow trench.

6. The method as recited in claim 1, further comprising:

forming spacers upon sidewall surfaces of said conductive structures by:

depositing a conformal CVD oxide upon said conductive structure and upon said protective layer; and anisotropically etching said oxide to form said spacers upon the sidewall surfaces of said conductive structures.

7. A method for forming an isolation structure, comprising:

providing a lightly doped silicon substrate;

forming a shallow trench isolation structure into field regions of said silicon substrate, wherein said field regions electrically isolate active regions of said silicon substrate;

depositing a CVD trench oxide, from a TEOS source at a temperature of approximately 400–800° C., into said shallow trench isolation structure, wherein an upper surface of said trench oxide is at the same level as an upper surface of said silicon substrate;

forming a nitride protective layer, subsequent to depositing a CVD trench oxide into said shallow trench structure, upon the upper surface of said trench oxide and said silicon substrate;

removing a portion of said nitride protective layer above said active regions while maintaining a portion of said nitride protective layer upon the upper surface of said trench oxide;

forming polysilicon conductive structures upon said protective layer and active regions; and forming oxide spacers upon sidewall surfaces of said conductive structures.

8. The method as recited in claim 7, wherein the step of forming said shallow trench comprises:

depositing a photoresist layer upon said silicon substrate;

exposing a portion of said photoresist layer using a mask;

removing exposed portion of said photoresist to expose the field regions of said silicon substrate; and anisotropically etching a shallow trench void into said silicon substrate.

9. The method as recited in claim 7, wherein the step of forming said oxide spacers upon said sidewall surfaces of said conductive structures comprises:

depositing a CVD oxide upon said conductive structure, said protective layer, and said active regions;

anisotropically etching said oxide to form said spacers upon the sidewall surfaces of said conductive structures.

* * * * *

UNITED STATES PATENT AND TRADEMARK OFFICE

CERTIFICATE OF CORRECTION

PATENT NO. :   5,923,992

DATED :   July 13, 1999

INVENTOR(S) :   Spikes et al.

It is certified that error appears in the above-identified patent and that said Letters Patent is hereby corrected as shown below:

In the Title Page:

Item: [73] Assignee: Advanced Micro Devices, Inc., please delete "Houston, Tex." and substitute therefor --Sunnyvale, CA--.

Signed and Sealed this

Eighth Day of August, 2000

*Attest:*

Q. TODD DICKINSON

*Attesting Officer*     *Director of Patents and Trademarks*